United States Patent
Lee et al.

(10) Patent No.: US 12,289,938 B2
(45) Date of Patent: Apr. 29, 2025

(54) DISPLAY DEVICE

(71) Applicant: LG DISPLAY CO., LTD., Seoul (KR)

(72) Inventors: Tae Gyu Lee, Paju-si (KR); Jung Eun Lee, Seoul (KR); Kyung Ha Lee, Seoul (KR)

(73) Assignee: LG Display Co., Ltd. (KR)

( * ) Notice: Subject to any disclaimer, the term of this patent is extended or adjusted under 35 U.S.C. 154(b) by 343 days.

(21) Appl. No.: 17/519,072

(22) Filed: Nov. 4, 2021

(65) Prior Publication Data
US 2022/0165787 A1    May 26, 2022

(30) Foreign Application Priority Data

Nov. 26, 2020 (KR) .......................... 10-2020-0161290

(51) Int. Cl.
| | |
|---|---|
| *H10H 29/14* | (2025.01) |
| *H10H 20/821* | (2025.01) |
| *H10H 20/831* | (2025.01) |
| *H10H 20/832* | (2025.01) |
| *H10H 20/84* | (2025.01) |
| *H10H 20/851* | (2025.01) |
| *H10H 20/855* | (2025.01) |

(52) U.S. Cl.
CPC ........ *H10H 29/142* (2025.01); *H10H 20/821* (2025.01); *H10H 20/831* (2025.01); *H10H 20/835* (2025.01); *H10H 20/84* (2025.01); *H10H 20/851* (2025.01); *H10H 20/855* (2025.01)

(58) Field of Classification Search
CPC ....... H01L 27/156; H01L 33/24; H01L 33/38; H01L 33/405; H01L 33/44; H01L 33/50; H01L 33/58
See application file for complete search history.

(56) References Cited

U.S. PATENT DOCUMENTS

| | | | |
|---|---|---|---|
| 2020/0105826 A1* | 4/2020 | Kim | ...................... H01L 33/405 |
| 2021/0126045 A1* | 4/2021 | Yeon | ...................... H01L 33/505 |
| 2022/0077225 A1* | 3/2022 | Kim | ..................... H01L 25/0753 |

FOREIGN PATENT DOCUMENTS

KR    10-2022-0031851 A    3/2022

OTHER PUBLICATIONS

Korean Office Action dated Sep. 4, 2024 issued in Patent Application No. 10-2020-0161290 (5 pages).

\* cited by examiner

*Primary Examiner* — Jay C Kim
*Assistant Examiner* — Woo K Lee
(74) *Attorney, Agent, or Firm* — Fish & Richardson P.C.

(57) ABSTRACT

A display device capable of improving a light emission efficiency includes a plurality of insulating films disposed on a substrate, a trench exposing side surfaces of the plurality of insulating films, a first alignment electrode disposed on the side surfaces of the plurality of insulating films exposed by the trench, a second alignment electrode disposed so as to be surrounded by the first alignment electrode, and a light-emitting device connected to the first and second alignment electrodes and disposed between the first and second alignment electrodes within the trench, thereby improving a light emission efficiency.

19 Claims, 11 Drawing Sheets

FIG. 4A
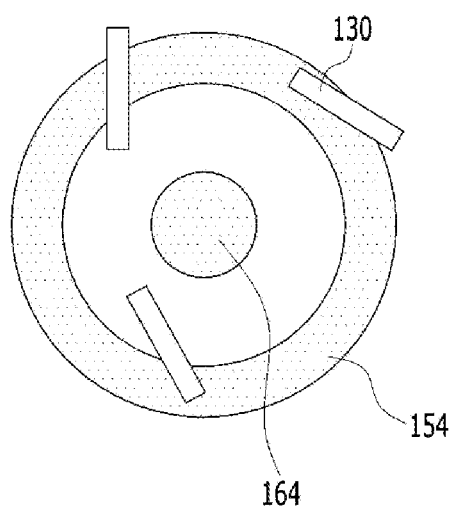
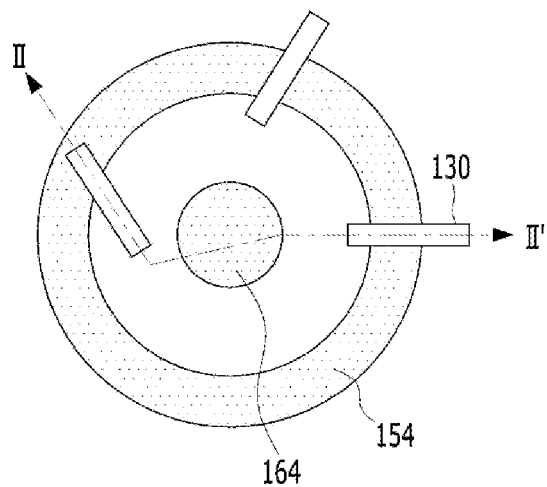

FIG. 5A
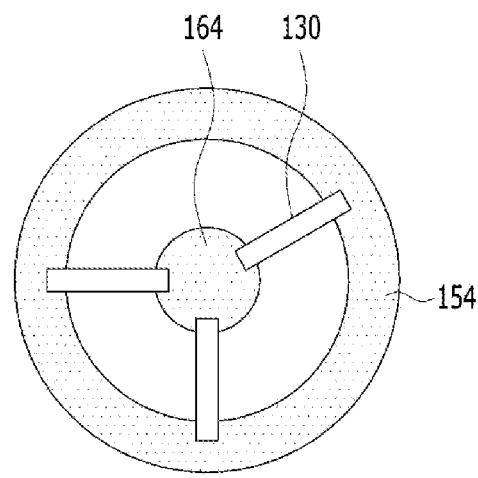
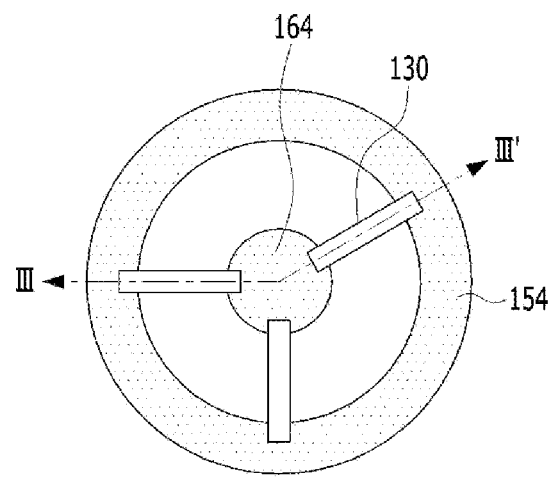

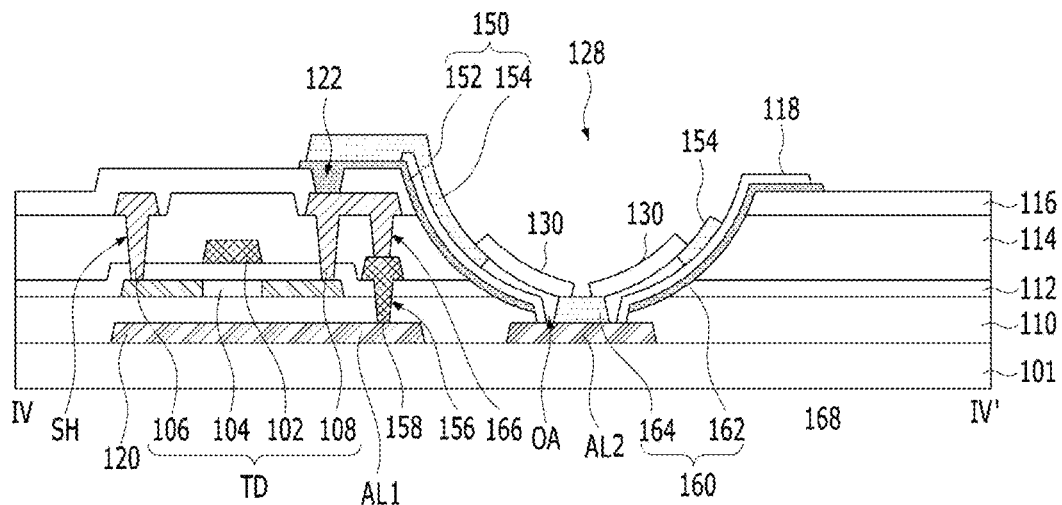

DISPLAY DEVICE

CROSS-REFERENCE TO RELATED APPLICATION

This application claims the benefit of Korean Patent Application No. 10-2020-0161290, filed on Nov. 26, 2020, which is hereby incorporated by reference in its entirety as if fully set forth herein.

BACKGROUND

Field of the Disclosure

The present disclosure relates to a display device, and more particularly to a display device capable of exhibiting improved emission efficiency.

Description of the Background

Nowadays, with the advent of information society, the requirements for display devices for representing information are increasing. Various types of display devices, such as liquid crystal display devices, plasma display devices, and organic light-emitting display devices, have been used. Recently, a display device using a micro light-emitting diode (μLED) has been developed. The micro light-emitting diode is an ultra-small light-emitting diode having a size of several tens of micrometers (μm) or less.

Since a display device using a micro light-emitting diode can be miniaturized and made lightweight, it can be variously used in smartwatches, mobile devices, virtual-reality devices, augmented-reality devices, flexible display devices, etc. In addition, because a display device including a micro light-emitting diode is a highly efficient low-power device, the lifespan thereof is long, warmup time is not required, and the turn-on speed and the turn-off speed thereof are very high.

However, a display device including a micro light-emitting diode has a structural problem in which it is difficult to concentrate side light, diffused to the side surface of the light-emitting diode, in the front direction of the display device and in which a hole-electron recombination path is limited to a linear path, which deteriorates emission efficiency.

SUMMARY

Accordingly, the present disclosure is directed to a display device that substantially obviates one or more problems due to limitations and disadvantages of the background art.

The present disclosure is to provide a display device capable of exhibiting improved emission efficiency.

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these and other advantages and in accordance with the purpose of the disclosure, as embodied and broadly described herein, a display device includes a plurality of insulating films disposed on a substrate, a trench exposing side surfaces of the plurality of insulating films, a first alignment electrode disposed on the side surfaces of the plurality of insulating films exposed by the trench, a second alignment electrode disposed so as to be surrounded by the first alignment electrode, and a light-emitting device connected to the first and second alignment electrodes and disposed between the first and second alignment electrodes within the trench.

To achieve the above, a display device comprises a plurality of insulating films disposed on a substrate, a trench exposing side surfaces of the plurality of insulating films, at least two pairs of first and second electrodes disposed in the trench, and at least two light-emitting devices disposed between each pair of first and second electrodes.

In another aspect of the present disclosure, a display device comprises a plurality of insulating films disposed on a substrate; a light collecting cavity exposing the side surfaces of the plurality of insulating films; a first alignment electrode disposed on side surfaces of the plurality of insulating films; a second alignment electrode surrounded by the first alignment electrode; and a light-emitting device connected to the first alignment electrode and the second alignment electrode and disposed between the first alignment electrode and the second alignment electrode in the light collecting cavity, wherein the light collecting cavity has a cross-sectional width that increases as being vertically away from the light-emitting device and serves to combine light directing to a displaying area with light moving toward a non-displaying area.

The first alignment electrode may be spaced apart from the second alignment electrode by a predetermined distance around the second alignment electrode.

The first alignment electrode may be formed to have a hollow circular shape, and the second alignment electrode may be formed to have a circular shape.

The display device may further include a first reflective electrode, connected to the first alignment electrode, and a second reflective electrode, connected to the second alignment electrode. Each of the first and second reflective electrodes is disposed between the side surfaces of the plurality of insulating films and the first alignment electrode.

The display device may further include a driving transistor, connected to one of the first and second alignment electrodes, and a switching transistor, connected to the driving transistor.

The display device may further include a first alignment signal line, connected to the first alignment electrode, and a second alignment signal line, disposed parallel to the first alignment signal line and connected to the second alignment electrode.

The display device may further include a light-blocking layer overlapping each of the driving transistor and the switching transistor. The first and second alignment signal lines may be formed of the same material and in the same plane as the light-blocking layer.

The display device may further include first and second color layers, embedded in the trench, and a black matrix, disposed between the first and second color layers and overlapping the driving transistor.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings:

FIGS. 4A and 4B are views showing an inkjet printing process performed on the light-emitting device shown in FIGS. 1 and 2;

FIGS. 5A and 5B are views showing an alignment process performed on the light-emitting device shown in FIGS. 1 and 2;

FIG. 7 is a cross-sectional view showing the display device shown in FIG. 6;

FIG. 8 is a cross-sectional view showing a first aspect of a color layer of the display device according to the present disclosure;

DETAILED DESCRIPTION

Reference will now be made in detail to exemplary aspects of the present disclosure, examples of which are illustrated in the accompanying drawings.

Figure 1:
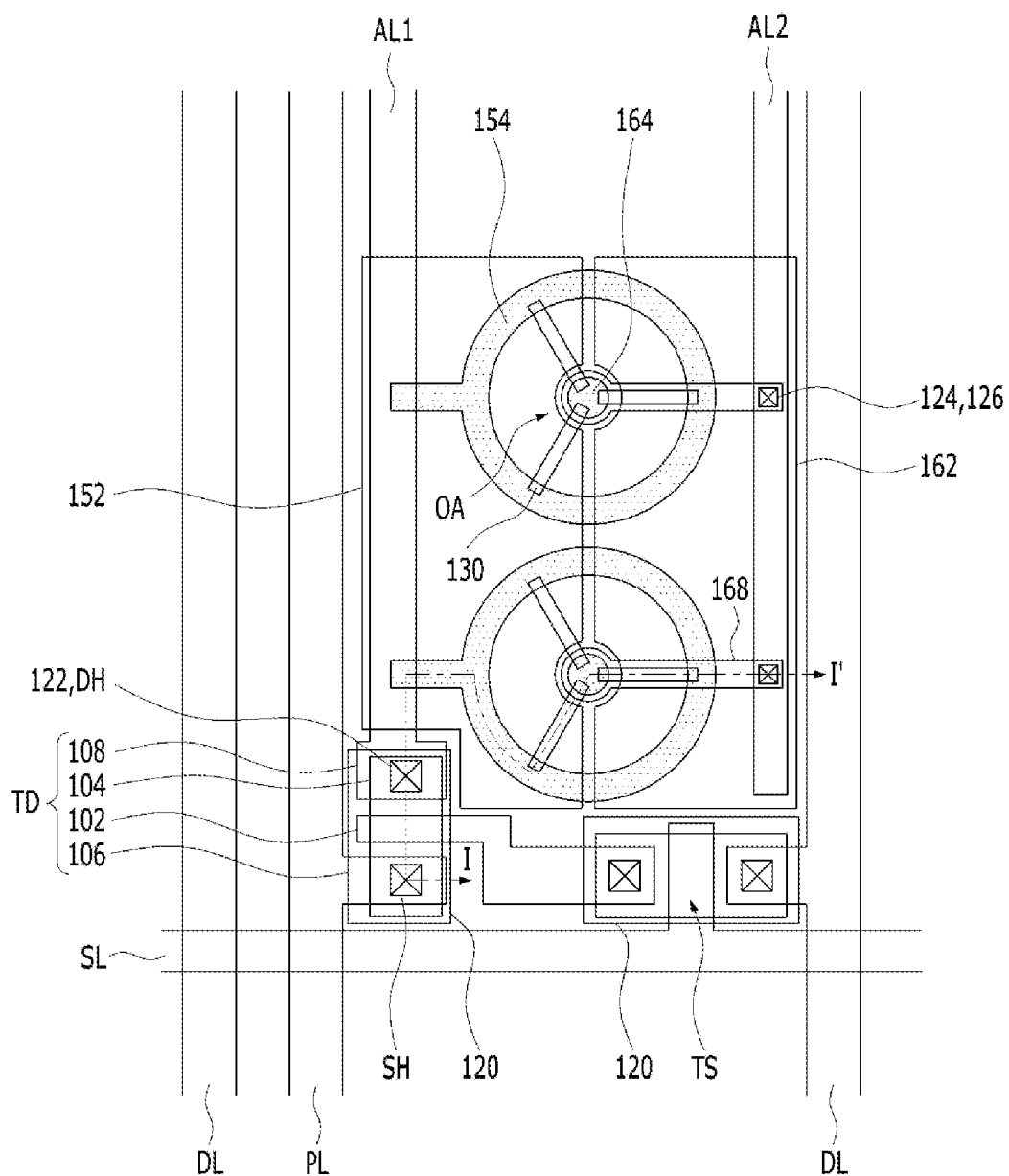
FIG. 1 is a plan view showing a display device according to a first aspect of the present disclosure.
Figure 2:
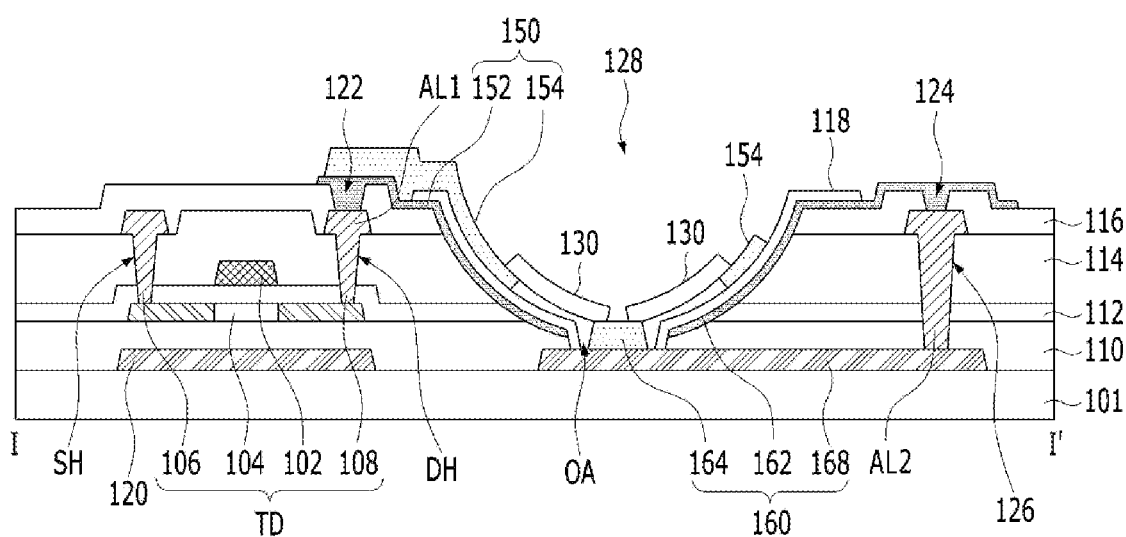
FIG. 2 is a cross-sectional view showing the display device shown in FIG. 1.

FIG. 1 is a plan view showing one subpixel of a display device according to the present disclosure, and FIG. 2 is a cross-sectional view taken along line I-I' in FIG. 1.

As shown in FIGS. 1 and 2, each subpixel of the display device includes at least two thin-film transistors TS and TD, first and second electrodes 150 and 160 electrically connected to the thin-film transistors TS and TD, and a light-emitting device 130 electrically connected to each of the first and second electrodes 150 and 160 and having a size of several tens of micrometers (μm) or less. At least one pair of first and second electrodes 150 and 160 is disposed in each sub-pixel, and at least one light-emitting device 130 is disposed between each pair of first and second electrodes 150 and 160. FIG. 1 shows that two pairs of first and second electrodes 150 and 160 are disposed in each sub-pixel, and three light-emitting devices 130 are disposed between the first and second electrodes 150 and 160 of each pair.

The at least two thin-film transistors include at least one switching transistor TS and at least one driving transistor TD.

When a scan pulse is supplied to a scan line SL, the switching transistor TS is turned on and supplies a data signal supplied to a data line DL to a storage capacitor (not shown in the drawings) and a gate electrode 102 of the driving transistor TD. To this end, the switching transistor TS includes a gate electrode connected to the scan line SL, a source electrode connected to the data line DL, a drain electrode connected to the driving transistor TD, and a semiconductor layer forming a channel between the source and drain electrodes.

The driving transistor TD controls the current supplied from a high-voltage (VDD) supply line PL to the light-emitting device 130 in response to the data signal supplied to the gate electrode 102 of the driving transistor TD, thereby adjusting the amount of light emitted from the light-emitting device 130. Even when the switching transistor TS is turned off, the driving transistor TD maintains the emission of light by the light-emitting device 130 by supplying a constant amount of current thereto using the voltage charged in the storage capacitor until the data signal of the next frame is supplied.

As shown in FIGS. 1 and 2, the driving transistor TD includes a pixel semiconductor layer 104 disposed on a buffer layer 110, a gate electrode 102 overlapping with the pixel semiconductor layer 104, with a gate insulating film 112 interposed therebetween, and source and drain electrodes 106 and 108 formed on an interlayer insulating film 114 so as to be in contact with the pixel semiconductor layer 104.

The pixel semiconductor layer 104 is formed of at least one of an amorphous semiconductor material, a polycrystalline semiconductor material and an oxide semiconductor material. The pixel semiconductor layer 104 is formed on the buffer layer 110. The pixel semiconductor layer 104 includes a channel region, a source region and a drain region. The channel region overlaps with the gate electrode 102, with the gate insulating film 112 interposed therebetween, and is formed between the source and drain electrodes 106 and 108. The source region is exposed through a source contact hole SH, which penetrates the gate insulating film 112 and the interlayer insulating film 114, and is electrically connected to the source electrode 106. The drain region is exposed through a drain contact hole DH, which penetrates the gate insulating film 112 and the interlayer insulating film 114, and is electrically connected to the drain electrode 108.

A light-blocking layer 120 is disposed between the pixel semiconductor layer 104 and a substrate 101. The light-blocking layer 120 may overlap with the pixel semiconductor layer 104. Since the light-blocking layer 120 absorbs or reflects light incident thereon from the rear surface of the substrate 101, the incidence of light on the channel region of the pixel semiconductor layer 104 can be prevented or minimized. The light-blocking layer 120 may be formed in a single-layered structure or a multi-layered structure using an opaque metal including one of molybdenum (Mo), copper (Cu), aluminum (Al), titanium (Ti), chromium (Cr), silver (Ag), gold (Au), nickel (Ni), neodymium (Nd), tungsten (W), and an alloy thereof.

The gate electrode 102 is formed on the gate insulating film 112, and overlaps with the channel region of the pixel semiconductor layer 104, with the gate insulating film 112 interposed therebetween. The gate electrode 102 is formed in a single-layered structure or a multi-layered structure using a first conductive material including one of molybdenum (Mo), aluminum (Al), chromium (Cr), gold (Au), silver (Ag), titanium (Ti), nickel (Ni), neodymium (Nd), tungsten (W), copper (Cu), and an alloy thereof.

The source electrode 106 is connected to the source region of the pixel semiconductor layer 104, which is exposed through the source contact hole SH, which penetrates the gate insulating film 112 and the interlayer insulating film 114. The drain electrode 108 faces the source electrode 106, and is connected to the drain region of the pixel semiconductor layer 104 through the drain contact hole DH, which penetrates the gate insulating film 112 and the interlayer insulating film 114. Each of the source and drain electrodes 106 and 108 is formed in a single-layered structure or a multi-layered structure using a second conductive material including one of molybdenum (Mo), aluminum (Al), chromium (Cr), gold (Au), silver (Ag), titanium (Ti), nickel (Ni), neodymium (Nd), tungsten (W), copper (Cu), and an alloy thereof For example, an arrangement relationship between one pair of first and second electrodes 150 and 160 and two light-emitting devices 130 will be described as follows.

The first electrode 150 may be connected to a first light-emitting electrode of the light-emitting device 130 to serve as an anode. The first electrode 150 may be electrically connected to a first alignment signal line AL1, which extends from the drain electrode 108 of the driving transistor TD in a direction parallel to the data line DL. The first alignment signal line AL1 may be disposed on the interlayer insulating film 114 and may be formed of the same material as the drain electrode 108. The first alignment signal line AL1 supplies a first alignment signal to a first alignment electrode 154 of the first electrode 150 in a process of aligning the light-emitting device 130.

The first electrode 150 may include a first reflective electrode 152 and a first alignment electrode 154.

The first reflective electrode 152 is disposed on a first protective film 116 and is formed of an opaque conductive material. The first reflective electrode 152 is electrically connected to the first alignment signal line AL1, which is exposed through a first contact hole 122, which penetrates the first protective film 116. The first reflective electrode 152 is disposed between the side surfaces of the plurality of insulating films 110, 112, 114 and 116, which are exposed by a trench 128, and the first alignment electrode 154.

The first alignment electrode 154 is disposed on a second protective film 118. The first alignment electrode 154 is connected to the first reflective electrode 152 exposed by the second protective film 118. The first alignment electrode 154 is in contact with one side of the light-emitting device 130 so as to be electrically connected to the light-emitting device 130.

The first alignment electrode 154 is formed in a circular shape that extends in a circumferential direction around a second alignment electrode 164. The first alignment electrode 154 is disposed so as to be spaced apart from the second alignment electrode 164 by a predetermined distance. Further, the first alignment electrode 154 is disposed so as to be spaced apart from a second alignment electrode 164 of the other pair by a predetermined distance.

The first alignment electrode 154 is formed of a transparent conductive material and is disposed so as to overlap with the first and second reflective electrodes 152 and 162. Accordingly, the first alignment electrode 154 allows the light reflected by the first and second reflective electrodes 152 and 162 to travel in a front direction in which an image is displayed.

The first alignment electrode 154 may be electrically connected to a power line PL in response to the switching operation of the driving transistor TD when an image is represented. Accordingly, the light-emitting device 130 may be electrically connected to the first electrode 150, which serves as an anode when an image is represented.

In addition, when an alignment process is performed, a first alignment signal is supplied to the first alignment electrode 154 from the first alignment signal line AL1 The first light-emitting electrode of the light-emitting device 130 is aligned with the first alignment electrode 154 that supplies the first alignment signal.

The second electrode 160 is connected to the second light-emitting electrode of the light-emitting device 130 to serve as a cathode. The second electrode 160 is electrically connected to a second alignment signal line AL2 disposed parallel to the first alignment signal line AL1. The second alignment signal line AL2 may be disposed on the interlayer insulating film 114 together with the first alignment signal line AL1 and may be formed of the same material as the drain electrode 108. The second alignment signal line AL2 supplies a second alignment signal to the second alignment electrode 164 of the second electrode 160 when a process of aligning the light-emitting device 130 is performed.

The second electrode 160 may include a second reflective electrode 162, a second alignment electrode 164, and a connection electrode 168.

The second reflective electrode 162 is disposed on the first protective film 116 and is formed of an opaque material. The second reflective electrode 162 is electrically connected to the second alignment signal line AL2, which is exposed through a second contact hole 124, which penetrates the first protective film 116. The second reflective electrode 162 is disposed between the side surfaces of the plurality of insulating films 110, 112, 114 and 116, which are exposed by the trench 128, and the second alignment electrode 164.

The second reflective electrode 162 may be disposed on the side surfaces of the buffer layer 110, the gate insulating film 112, the interlayer insulating film 114, and the first protective film 116, which are exposed by the trench 128, and may be formed of the same material as the first reflective electrode 152. Therefore, the second reflective electrode 162 is formed of a conductive material having the same reflectance as the material of the first reflective electrode 152. Accordingly, the first and second reflective electrodes 152 and 162 reflect light traveling in a direction different from the direction oriented toward the emission area (i.e., directions to which the screen is not displayed) overlapping with the trench 128 (i.e. a direction to which the screen is displayed), among the light beams emitted from the light-emitting device 130, to the emission area, thereby improving the efficiency of emission of light in the front direction. Thus, the trench 128 may be referred to as a light collecting cavity that can enhance a light emission efficiency. In addition, the first and second reflective electrodes 152 and 162 reflect light traveling to the switching and driving transistors TS and TD to the emission area, thereby preventing deterioration in the reliability of the switching and driving transistors TS and TD.

The second alignment electrode 164 is disposed on the connection electrode 168, and is in direct contact with the connection electrode 168 exposed by an open area OA, which penetrates the second protective film 118. The second alignment electrode 164 is in contact with the opposite side of the light-emitting device 130 so as to be electrically connected to the light-emitting device 130.

The second alignment electrode 164 is disposed so as to be spaced apart from the first alignment electrode 154 by a predetermined distance and to be surrounded by the first alignment electrode 154. For example, the second alignment electrode 164 may be formed to have a circular shape, and the first alignment electrode 154 may be formed to have a hollow circular shape. The second alignment electrode 164 may be disposed in the hollow portion of the first alignment electrode 154. Referring to FIGS. 1 and 2, the central region of the circular-shaped first alignment electrode 154 may be removed to form an opening exposing the second protective film 118. The opening in the first alignment electrode 154 may overlap the open area OA penetrating the second protective film 118 to expose the connection electrode 168. In addition, the second alignment electrode 164 may be disposed in the opening in the first alignment electrode 154, and may be in contact with the connection electrode 168, which is exposed through the open area OA penetrating the second protective film 118.

The second alignment electrode 164 may be formed of a transparent conductive material, which is the same as the material of the first alignment electrode 154. The second alignment electrode 164 is formed of a transparent conductive material so that the light reflected by the connection electrode 168 is capable of traveling in the front direction in which an image is displayed.

When an image is represented, ground voltage GND or low voltage VSS is supplied from the second alignment signal line AL2 to the second alignment electrode 164 through the second connection electrode 168. Therefore, the light-emitting device 130 may be electrically connected to the second electrode 160, which serves as a cathode when an image is represented.

In addition, when an alignment process is performed, a second alignment signal may be supplied from the second alignment signal line AL2 to the second alignment electrode 164 through the connection electrode 168. Therefore, the second light-emitting electrode of the light-emitting device 130 is aligned with the second electrode 160 that supplies the second alignment signal.

Figure 3A:
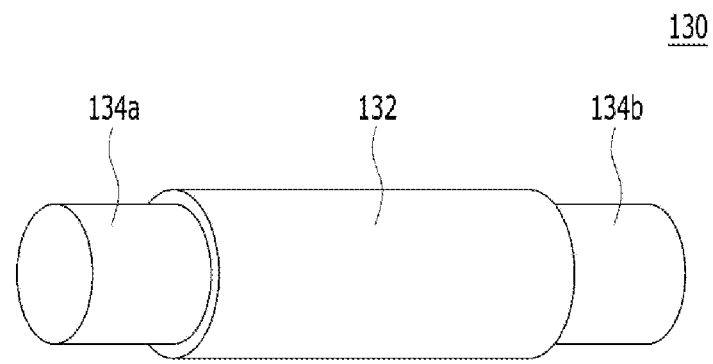
FIG. 3A is a perspective view showing the light-emitting device shown in FIG. 2.
Figure 3B:
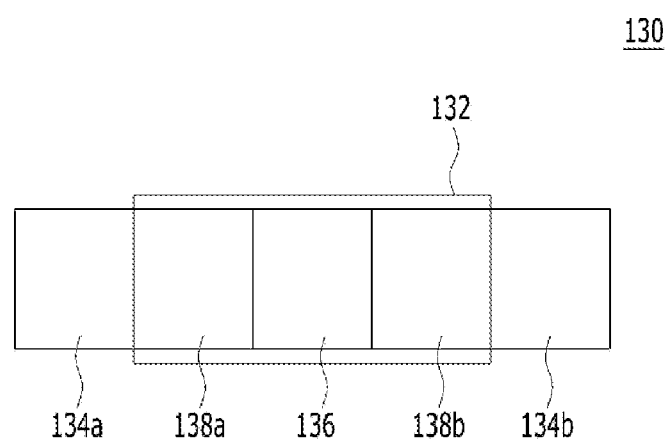
FIG. 3B is a cross-sectional view showing the light-emitting device shown in FIG. 2.

As shown in FIGS. 3A and 3B, the light-emitting device 130 may include first and second light-emitting electrodes 134a and 134b, first and second ohmic contact layers 138a and 138b, an active layer 136, and an outer protective film 132.

The first and second light-emitting electrodes 134a and 134b are formed of a conductive material including at least one of molybdenum (Mo), aluminum (Al), chromium (Cr), gold (Au), silver (Ag), titanium (Ti), nickel (Ni), neodymium (Nd), tungsten (W), and copper (Cu). The first light-emitting electrode 132a is electrically connected to one of the first and second electrodes 150 and 160 through an alignment process performed on the light-emitting device 130, and the second light-emitting electrode 134b is electrically connected to the other one of the first and second electrodes 150 and 160 through the alignment process performed on the light-emitting device 130.

The first ohmic contact layer 138a includes at least one n-type semiconductor layer. For example, the first ohmic contact layer 138a may include at least one semiconductor material selected from the group consisting of indium aluminum gallium nitride (InAlGaN), gallium nitride (GaN), aluminum gallium nitride (AlGaN), indium gallium nitride (InGaN), aluminum nitride (AlN), and indium nitride (InN), and may include a semiconductor layer doped with a first conductive dopant such as silicon (Si), germanium (Ge), or tin (Sn).

The active layer 136 is formed in a single-quantum-well structure or a multi-quantum-well structure on the first ohmic contact layer 138a. A cladding layer doped with a conductive dopant may be formed on at least one of the upper surface or the lower surface of the active layer 136. The cladding layer is formed as, for example, an aluminum gallium nitride (AlGaN) layer or an indium aluminum gallium nitride (InAlGaN) layer. In addition, a material such as aluminum gallium nitride (AlGaN) or indium aluminum gallium nitride (InAlGaN) may also be used for the active layer 136. When an electric field having a predetermined voltage or more is applied to the first and second light-emitting electrodes 134a and 134b of the light-emitting device 130, the light-emitting device 130 may emit light due to the combination of electron-hole pairs in the active layer 136.

The second ohmic contact layer 138b is formed on the active layer 136, and includes at least one p-type semiconductor layer, which is of a different type from the first ohmic contact layer 138a. For example, the second ohmic contact layer 138b may include at least one semiconductor material selected from the group consisting of indium aluminum gallium nitride (InAlGaN), gallium nitride (GaN), aluminum gallium nitride (AlGaN), indium gallium nitride (InGaN), aluminum nitride (AlN), and indium nitride (InN), and may include a semiconductor layer doped with a second conductive dopant such as magnesium (Mg).

The outer protective film 132 may be formed so as to cover the outer peripheral surface of each of the first and second ohmic contact layers 138a and 138b and the active layer 136, except for the first and second light-emitting electrodes 134a and 134b, so that the first and second light-emitting electrodes 134a and 134b are exposed. The outer protective film 132 may be formed of a transparent insulating material so that light emitted from the active layer 136 is radiated therethrough. For example, the outer protective film 132 may be formed of at least one insulating material selected from the group consisting of silicon dioxide ($SiO_2$), silicon nitride ($Si_3N_4$), aluminum oxide ($Al_2O_3$), and titanium dioxide ($TiO_2$).

The outer protective film 132 may prevent contact between the active layer 136 and conductive layers disposed around the light-emitting device 130, thereby preventing the occurrence of a short circuit between the same. In addition, since the outer protective film 132 is disposed so as to surround the outer peripheral surface of the light-emitting device 130, it is possible to minimize surface defects of the light-emitting device 130, thereby improving the lifespan and efficiency of the light-emitting device 130.

The light-emitting device 130 may be disposed in the trench 128, which is formed by removing portions of the buffer layer 110, the gate insulating film 112, the interlayer insulating film 114, and the first protective film 116. However, the aspect is not limited to any specific shape or configuration of the trench 128, so long as it allows the light generated by the light-emitting device 130 to be concentrated toward the screen of the display device, thereby improving light extraction efficiency. For example, the side surfaces of the buffer layer 110, the gate insulating film 112, the interlayer insulating film 114, and the first protective film 116, which are exposed by the trench 128, are formed in a curved surface shape or an inclined surface shape. That is, as shown in FIG. 2, the trench 128 may be formed in the shape of a cup having a semicircular-shaped cross-section or an inclined surface. Thus, the trench 128 may be formed such that the width thereof gradually increases from the buffer layer 110, which is located at a lower side, to the first protective film 116, which is located at an upper side.

Figure 4B:
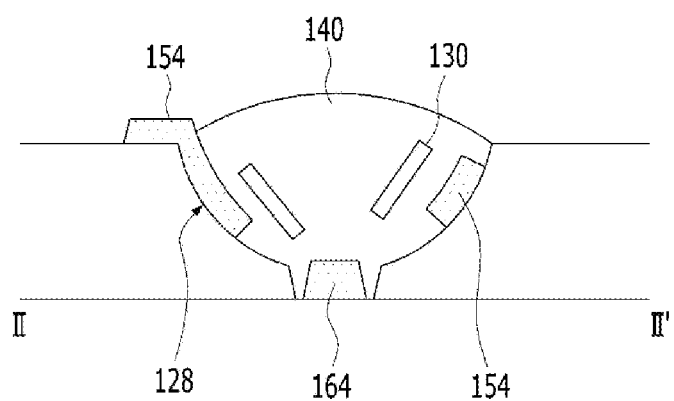

As shown in FIGS. 4A and 4B, the light-emitting device 130 is sprayed into the trench 128 in the state of a solution mixed with a solvent 140 through an inkjet printing process.

Figure 5B:
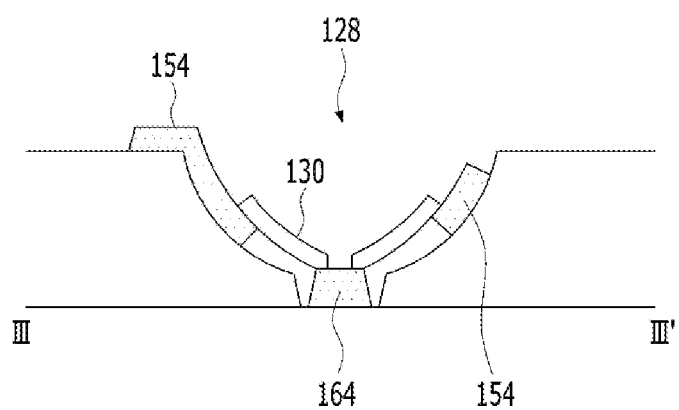

Subsequently, a first alignment signal is applied to the first alignment electrode 154 from the first alignment signal line AL1, and a second alignment signal is applied to the second alignment electrode 164 from the second alignment signal line AL2. At this time, since the first and second alignment signals have different voltages from each other, an electric field is radially formed between the first and second alignment electrodes 154 and 164 according to a potential difference between the first and second alignment electrodes 154 and 164. Bipolarity is induced in the light-emitting device 130 by the electric field, and a dielectrophoretic force is applied to a side of the light-emitting device 130 at which the gradient of the electric field is large or small. As shown in FIGS. 5A and 5B, the light-emitting device 130 is self-aligned between the first and second alignment electrodes 154 and 164 by the dielectrophoretic force. For example, the light-emitting device 130 is self-aligned between the first and second alignment electrodes 154 and 164 along a first electric field, which is radially formed around the first alignment electrode 154. At this time, the first alignment electrode 154 is electrically connected to the first light-emitting electrode 134a of the light-emitting device 130, and the second alignment electrode 164 is electrically connected to the second light-emitting electrode 134b of the light-emitting device 130, since the first light-emitting electrode 134a is electrically connected to the first ohmic contact layer 138a having the n-type semiconductor layer and the second light-emitting electrode 134b is electrically connected to the second ohmic contact layer 138b having the p-type semiconductor layer. After the light-emitting device 130 is aligned, the solvent is vaporized and removed at room temperature or by heat applied thereto, with the result that the light-emitting device 130 is disposed between the first and second alignment electrodes 154 and 164.

As described above, in the display device according to the present disclosure, the trench 128 is formed using at least one of the plurality of insulating films 110, 112, 114 and 116 disposed between the substrate 101 and the reflective electrodes 152 and 162. Accordingly, the first and second reflective electrodes 152 and 162 may be disposed on the portions of the plurality of insulating films 110, 112, 114 and 116 that are exposed by the trench 128, which is formed such that the width thereof gradually increases from the lower portion thereof to the upper portion thereof. Therefore, in the display device according to the present disclosure, the emission efficiency of the light-emitting device 130 may be increased by the first and second reflective electrodes 152 and 162 disposed on the plurality of insulating films 110, 112, 114 and 116 exposed by the trench 128. In addition, in the display device according to the present disclosure, the first and second reflective electrodes 152 and 162 concentrate light traveling to the non-emission area onto the emission area overlapping the trench 128, thereby increasing emission efficiency.

In addition, in the display device according to the present disclosure, the light-emitting device 130 is sprayed into the trench 128 through an inkjet spray process, whereby it is possible to omit a separate partition wall structure, thereby reducing processing costs and the number of processes.

In addition, in the display device according to the present disclosure, the same number of light-emitting devices 130 is sprayed into each trench 128 in the state of a solution mixed with a solvent, whereby the same number of light-emitting devices 130 is disposed in each subpixel. Accordingly, the display device according to the present disclosure is capable of realizing uniform brightness of the subpixels.

Figure 6:
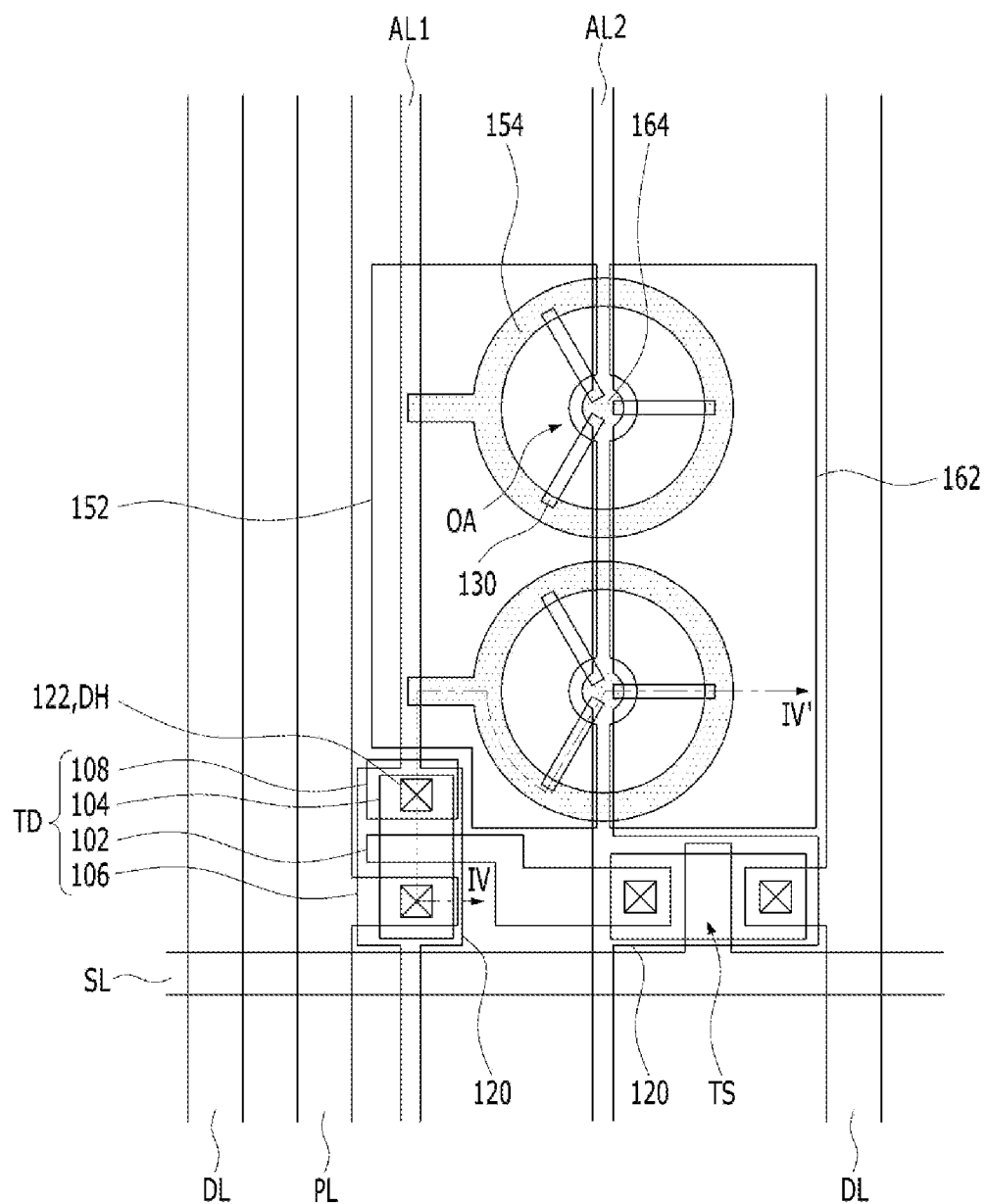
FIG. 6 is a plan view showing a display device according to a second aspect of the present disclosure.

FIG. 6 is a plan view showing a display device according to a second aspect of the present disclosure, and FIG. 7 is a cross-sectional view showing the display device according to the second aspect of the present disclosure.

The display device shown in FIGS. 6 and 7 includes the same components as the display device shown in FIGS. 1 and 2 except that first and second alignment signal lines AL1 and AL2 are formed of the same material and in the same plane as a light-blocking layer 120. Therefore, a detailed description of the same components will be omitted.

A light-blocking layer 120, which overlaps a switching thin-film transistor TS, protrudes from the second alignment signal line AL2, and thus is electrically connected to the second alignment signal line AL2. The second alignment signal line AL2 is exposed by an open area OA penetrating a second protective film 118, and is in direct contact with a second alignment electrode 164.

A light-blocking layer 120, which overlaps a driving thin-film transistor TD, protrudes from the first alignment signal line AL1, and thus is electrically connected to the first alignment signal line AL1.

The first alignment signal line AL1 is electrically connected to a drain electrode 108 of the driving transistor via a second connection electrode 158. The second connection electrode 158 is electrically connected to the portion of the first alignment signal line that is exposed through a first alignment contact hole 156, which penetrates a buffer layer 110 and a gate insulating film 112. The second connection electrode 158 is exposed through a second alignment contact hole 166, which penetrates an interlayer insulating film 114, and is electrically connected to the drain electrode 108 of the driving transistor TD. At this time, because the second connection electrode 158 is formed together with a gate electrode 102, the second connection electrode 158 may be formed of the same material as the gate electrode 102, so long as it can be disposed in the same plane as the gate electrode 102.

Figure 9:
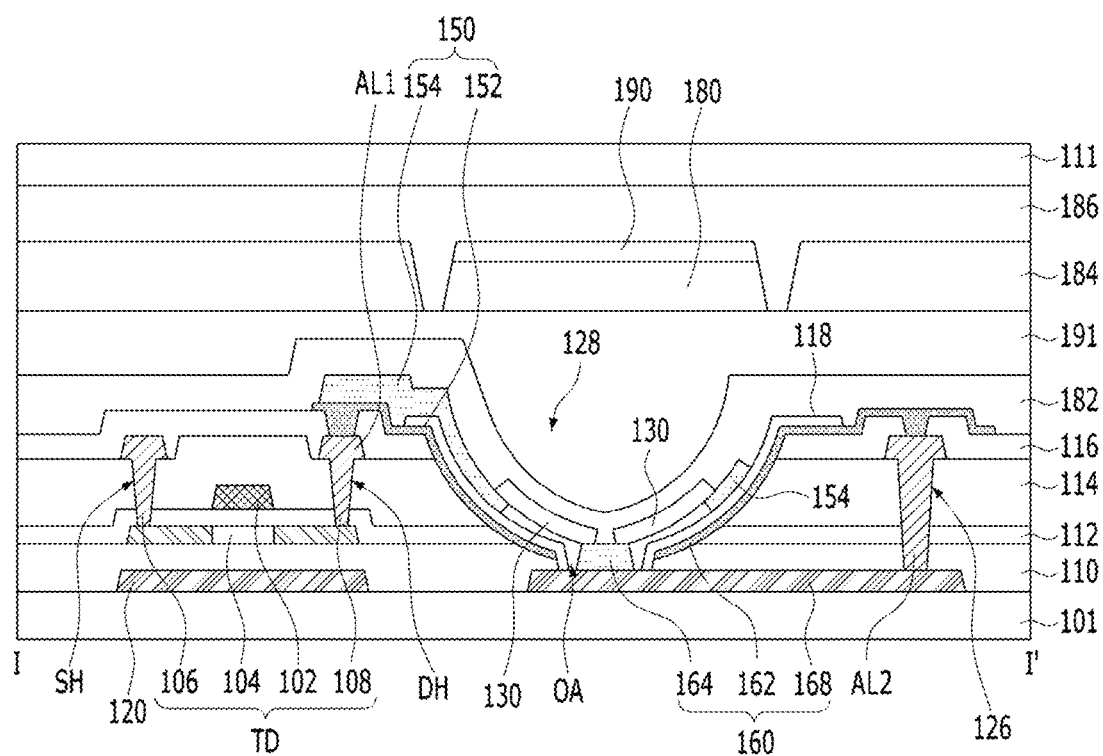
FIG. 9 is a cross-sectional view showing a second aspect of a color layer of the display device according to the present disclosure.

As shown in FIGS. 8 and 9, the display device according to the present disclosure may include at least one of a first color layer 180 or a second color layer 190. In the present disclosure, a structure in which the first color layer 180 and the second color layer 190 are sequentially stacked will be described by way of example.

Figure 10:
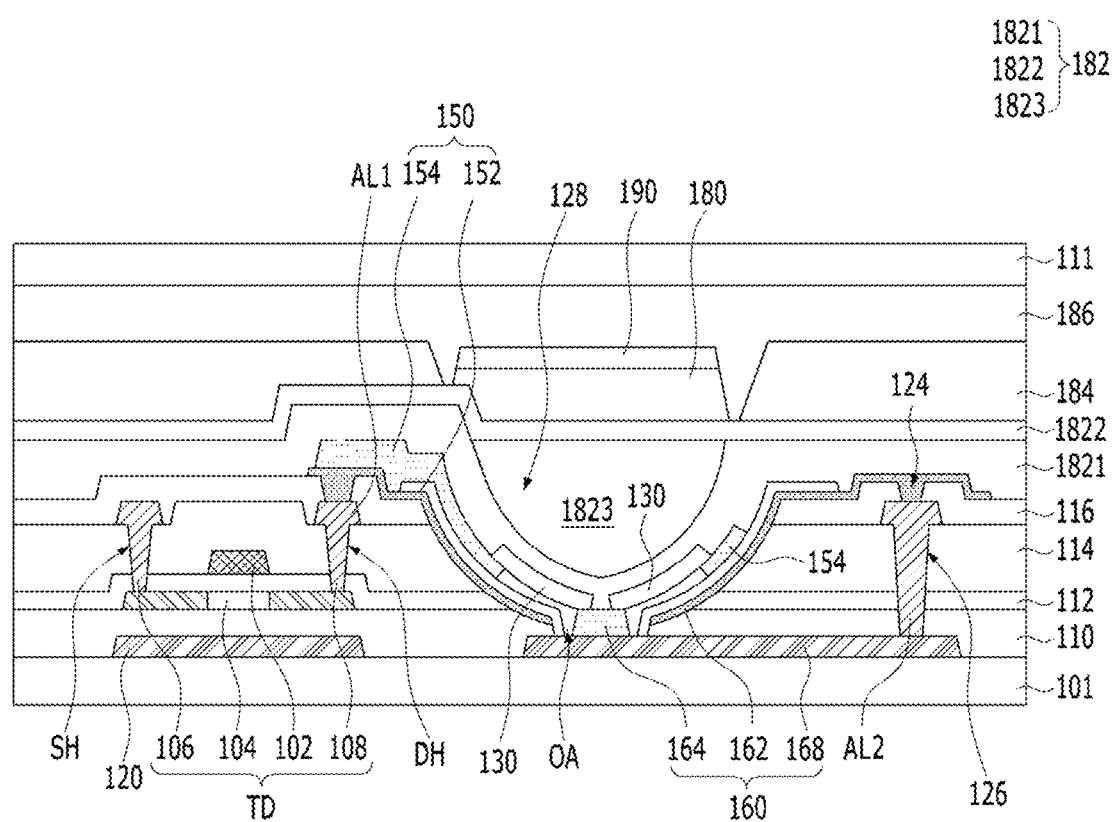
FIG. 10 is a cross-sectional view showing the third protective film shown in FIG. 8 in detail.

The first color layer 180 is disposed on a third protective film 182, which is formed in order to fix the position of the light-emitting device 130, which is aligned on each of the first and second electrodes 150 and 160. In this case, the third protective film 182 is formed of a material capable of encapsulating the light-emitting device in order to protect the light-emitting device from moisture and oxygen. For example, the third protective film 182 may be formed as an inorganic encapsulation layer, such as a silicon nitride (SiNx) film or a silicon oxide (SiOx) film, and may be formed in a single-layered structure or a multi-layered structure in which the silicon nitride (SiNx) film and the silicon oxide (SiOx) film are stacked. However, the aspect is not limited thereto. As shown in FIG. 10, the third protective film 182 may include multiple inorganic encapsulation layers 1821 and 1822 and an organic encapsulation layer 1823 disposed between the multiple inorganic encapsulation layers 1821 and 1822. In this case, the organic encapsulation layer 1823 may be embedded in the trench 128, and the first and second color layers 180 and 190 may be disposed on the organic encapsulation layer 1823.

As shown in FIG. 8, the first color layer 180 may be embedded in the trench 128. Alternatively, as shown in FIG. 9, the first color layer 180 may be disposed on the first planarization layer 182 filling the trench 128. The first color layer 180 may include a red quantum dot layer disposed in a red subpixel area, a green quantum dot layer disposed in a green subpixel area, and a blue quantum dot layer disposed in a blue subpixel area.

The second color layer 190 may be disposed on the first color layer 180. The second color layer 190 may include a red color filter disposed in the red subpixel area, a green color filter disposed in the green subpixel area, and a blue color filter disposed in the blue subpixel area.

Accordingly, white light having wavelengths of various colors, generated by the light-emitting device 130, passes through the first color layer 180 and is converted into light having the wavelength of a color corresponding to the first color layer 180. Accordingly, because the white light generated by the light-emitting device 130 passes through the second color layer 190 in the state of being converted into light having the wavelength of a color corresponding to the first color layer 180, the amount of light absorbed by the second color layer 190, which is a color filter, decreases, so emission efficiency is improved.

Since blue light has higher energy than white light, it is difficult for the blue quantum dot to convert white light into blue light. Therefore, the first color layer 180, which is composed of the blue quantum dot layer, may not be disposed in the blue subpixel area, but the second color layer 190, which is composed of the blue color filter, may be additionally disposed in the blue subpixel area. Accordingly, the second color layer in the blue subpixel area absorbs light of wavelengths other than blue light from the white light generated from the light-emitting device 130, and transmits only blue light.

A black matrix 184 may be disposed between the color units, each of which includes the first and second color layers 180 and 190. The black matrix 184 defines each subpixel area and prevents light interference and light leakage between adjacent subpixel areas. The black matrix 184 is formed of a black insulating material having high resistance, or is formed by stacking at least two color filters among the red (R), green (G), and blue (B) color filters 190. In addition, a second planarization layer 186 is formed on the substrate 101 on which the first and second color layers 180 and 190 and the black matrix 184 have been formed. The substrate 101 on which the first and second color layers 180 and 190 and the black matrix 184 have been formed is planarized by the second planarization layer 186. A cover substrate 111 is disposed on the second planarization layer 186 planarizing the substrate 101.

A method of manufacturing the display device according to the present disclosure will now be described. First, switching and driving transistors TS and TD, a trench 128, and first and second electrodes 150 and 160 are formed on a substrate 101. Subsequently, a light-emitting device 130 is sprayed onto the substrate 101, on which the trench 128 is formed, through an inkjet spray process (shown in FIGS. 4A and 4B), and the light-emitting device 130 is aligned between the first and second electrodes 150 and 160 through an alignment process (shown in FIGS. 5A and 5B). Subsequently, color layers 180 and 190 and a black matrix 184 are formed on the light-emitting device 130, thereby completely manufacturing the display device. In the completely manufactured display device, the light-emitting device 130 emits light in response to driving signals supplied through the first electrode 150, which serves as an anode, and the second electrode 160, which serves as a cathode, thereby representing an image.

As is apparent from the above description, in the display device according to the present disclosure, a trench is formed using at least one of a plurality of insulating films disposed between a substrate and first and second reflective electrodes, and the first and second reflective electrodes are disposed on the side surfaces of the insulating films, which are exposed by the trench. Accordingly, the first and second reflective electrodes concentrate light traveling to a non-emission area onto an emission area overlapping the trench, that is, concentrate side light, diffused to the side surface of the light-emitting device, in the front direction of the display device, thereby improving emission efficiency.

In addition, in the display device according to the present disclosure, since the light-emitting device is sprayed into the trench through an inkjet spray process, it is possible to omit a separate partition wall structure, thereby reducing processing costs and the number of processes.

In addition, in the display device according to the present disclosure, the same number of light-emitting devices is sprayed into each trench in the state of a solution mixed with a solvent, whereby the same number of light-emitting devices is disposed in each subpixel. Accordingly, the display device according to the present disclosure is capable of realizing uniform brightness of the subpixels.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. A display device comprising:
   a plurality of insulating films disposed on a substrate, the plurality of insulating layers including at least a first insulating layer and a second insulating layer directly disposed on the first insulating layer;
   a trench disposed within the plurality of insulating films;
   a first reflective electrode disposed on a side surface of the plurality of insulating films exposed by the trench;
   a second reflective electrode disposed on the side surface of the plurality of insulating films;
   a protective film disposed on the first and second reflective electrodes;
   a first alignment electrode disposed on the protective film and connected to the first reflective electrode exposed by the protective film;
   a second alignment electrode horizontally surrounded by the first alignment electrode;
   a connection electrode disposed between the second alignment electrode and the substrate and connected to the second alignment electrode; and
   a light-emitting device connected to the first alignment electrode and the second alignment electrode and disposed horizontally between the first alignment electrode and the second alignment electrode in the trench,
   wherein the first alignment electrode and the second alignment electrode are electrically insulated from each other.

2. The display device according to claim 1, wherein the first alignment electrode is spaced apart from the second alignment electrode by a predetermined distance around the second alignment electrode.

3. The display device according to claim 1, wherein the first alignment electrode has a hollow circular shape, and the second alignment electrode has a circular shape.

4. The display device according to claim 1, further comprising:
   a driving transistor electrically connected to one of the first alignment electrode and the second alignment electrode; and
   a switching transistor electrically connected to the driving transistor.

5. The display device according to claim 4, further comprising:

a first alignment signal line electrically connected to the first alignment electrode; and
a second alignment signal line disposed parallel to the first alignment signal line and electrically connected to the second alignment electrode.

6. The display device according to claim 5, further comprising a light-blocking layer overlapping with each of the driving transistor and the switching transistor,
wherein the first alignment signal line and the second alignment signal line are formed of a same material and disposed at a same plane as the light-blocking layer.

7. The display device according to claim 4, further comprising:
first and second color layers disposed in the trench; and
a black matrix disposed between the first and second color layers and overlapping with the driving transistor.

8. A display device comprising:
a plurality of insulating films disposed on a substrate, the plurality of insulating layers including at least a first insulating layer and a second insulating layer directly disposed on the first insulating layer;
a trench disposed within the plurality of insulating films;
a first reflective electrode disposed on a side surface of the plurality of insulating films exposed by the trench;
a second reflective electrode disposed on the side surface of the plurality of insulating films;
a protective film disposed on the first and second reflective electrodes;
at least two pairs of first and second alignment electrodes disposed in the trench;
a connection electrode disposed between the second alignment electrode and the substrate; and
at least two light-emitting devices disposed between each pair of first and second electrodes,
wherein the first alignment electrode is disposed on the protective film and connected to the first reflective electrode exposed by the protective film,
wherein the second alignment electrode is horizontally surrounded by the first alignment electrode and connected to the connection electrode,
wherein the light-emitting device is disposed horizontally between the first alignment electrode and the second alignment electrode in the trench, and
wherein the first alignment electrode and the second alignment electrode are electrically insulated from each other.

9. The display device according to claim 8, wherein the first alignment electrode is spaced apart from the second alignment electrode by a predetermined distance around the second alignment electrode.

10. The display device according to claim 8, wherein first alignment electrode has a hollow circular shape, and the second alignment electrode has a circular shape.

11. The display device according to claim 8, further comprising:
a driving transistor electrically connected to one of each first alignment electrode and the second alignment electrode; and
a switching transistor electrically connected to the driving transistor.

12. The display device according to claim 11, further comprising:
a first alignment signal line electrically connected to the first alignment electrode; and
a second alignment signal line disposed parallel to the first alignment signal line and electrically connected to the second alignment electrode.

13. The display device according to claim 12, further comprising:
a light-blocking layer overlapping with each of the driving transistor and the switching transistor,
wherein the first alignment signal line and the second alignment signal line are formed of a same material and disposed at a same plane as the light-blocking layer.

14. The display device according to claim 11, further comprising:
first and second color layers disposed in the trench; and
a black matrix disposed between the first and second color layers and overlapping with the driving transistor.

15. A display device comprising:
a plurality of insulating films disposed on a substrate, the plurality of insulating layers including at least a first insulating layer and a second insulating layer directly disposed on the first insulating layer;
a light collecting cavity disposed within the plurality of insulating films;
a first reflective electrode disposed on a side surface of the plurality of insulating films exposed by the light collecting cavity;
a second reflective electrode disposed on the side surface of the plurality of insulating films;
a protective film disposed on the first and second reflective electrodes;
a first alignment electrode disposed on the protective film and connected to the first reflective electrode exposed by the protective film;
a second alignment electrode horizontally surrounded by the first alignment electrode;
a connection electrode disposed between the second alignment electrode and the substrate and connected to the second alignment electrode; and
a light-emitting device connected to the first alignment electrode and the second alignment electrode and disposed horizontally between the first alignment electrode and the second alignment electrode in the light collecting cavity,
wherein the light collecting cavity has a cross-sectional width that increases as being vertically away from the light-emitting device and serves to combine light directing to a displaying area with light moving toward a non-displaying area, and
wherein the first alignment electrode and the second alignment electrode are electrically insulated from each other.

16. The display device according to claim 15, further comprising:
a driving transistor electrically connected to one of the first alignment electrode and the second alignment electrode; and
a switching transistor electrically connected to the driving transistor.

17. The display device according to claim 16, further comprising:
a first alignment signal line electrically connected to the first alignment electrode; and
a second alignment signal line disposed parallel to the first alignment signal line and electrically connected to the second alignment electrode.

18. The display device according to claim 3, wherein a central region of the first alignment electrode is removed to from an open area penetrating the protective film, and the second alignment electrode is disposed in the open area.

19. The display device according to claim 10, wherein a central region of the first alignment electrode is removed to from an open area penetrating the protective film, and the second alignment electrode is disposed in the open area.

* * * * *